(12) United States Patent
Wight et al.

(10) Patent No.: US 6,429,638 B1
(45) Date of Patent: Aug. 6, 2002

(54) N-DIODE PEAK DETECTOR

(75) Inventors: Mark S. Wight; Stephane Gagnon, both of Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 40 days.

(21) Appl. No.: 09/652,677

(22) Filed: Aug. 31, 2000

(51) Int. Cl.[7] .......................... G01R 19/30; H03K 19/00
(52) U.S. Cl. ...................................... 324/103 P; 327/58
(58) Field of Search ...................... 324/103 P, 117 R, 324/76.65, 765; 322/28; 327/58

(56) References Cited

U.S. PATENT DOCUMENTS 6,064,238 A * 5/2000 Wight et al. ................. 327/58

* cited by examiner

*Primary Examiner*—N. Le
*Assistant Examiner*—James Kerveros

(57) ABSTRACT

A peak detector for measuring the voltage amplitude of low amplitude balanced digital signals. The N-diode peak detector uses the non-linear characteristics of a diode to convert a high speed low amplitude input signal into a DC voltage, linearly proportional to the signal amplitude (peak). A compensation circuit is designed to match the characteristics of a digital modulation signal and track over a large range of temperatures and signal amplitudes. The circuit can be used for digital and analog modulation signals. For analog signals, the peak detector uses a larger number of diodes or a reduced range.

19 Claims, 6 Drawing Sheets

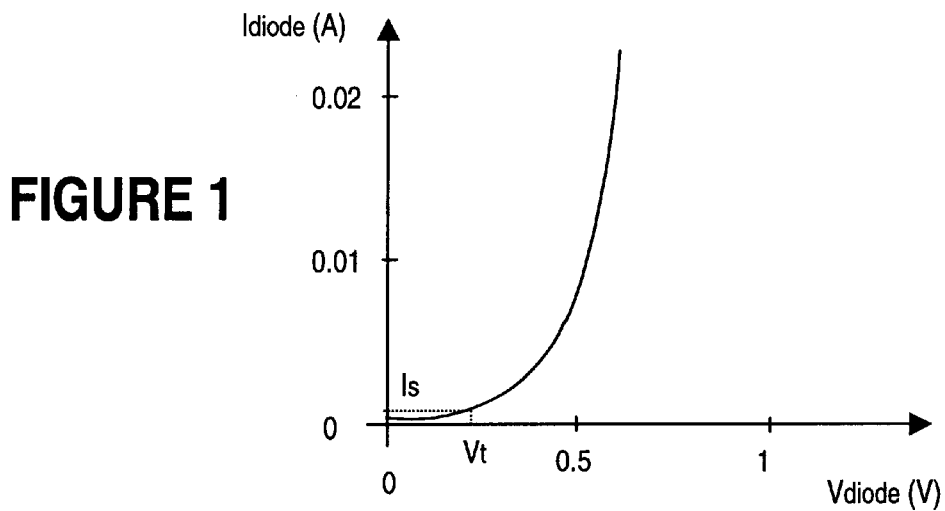
FIGURE 1
FIGURE 2A (Prior Art)
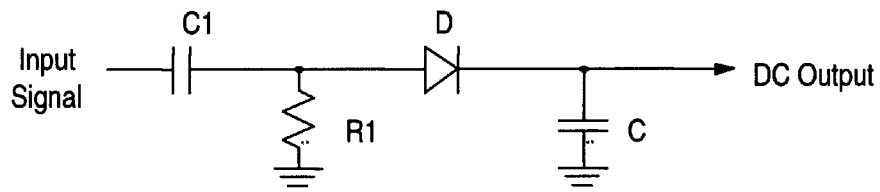
FIGURE 2B (Prior Art)
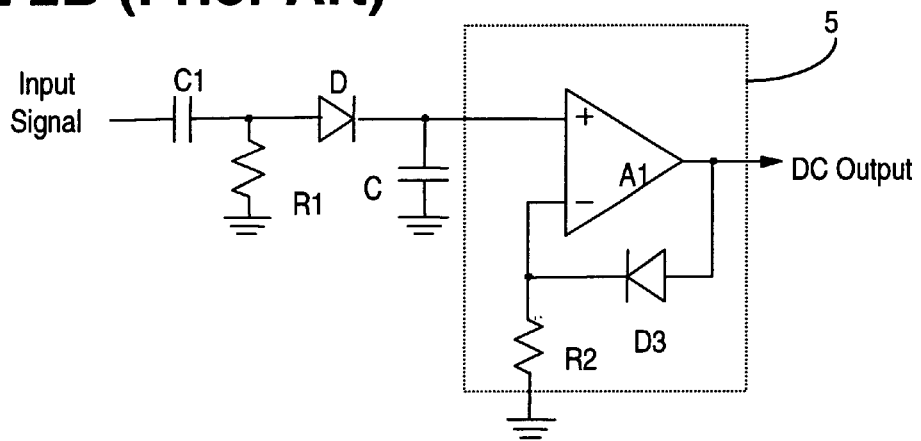

FIGURE 2C (Prior Art)
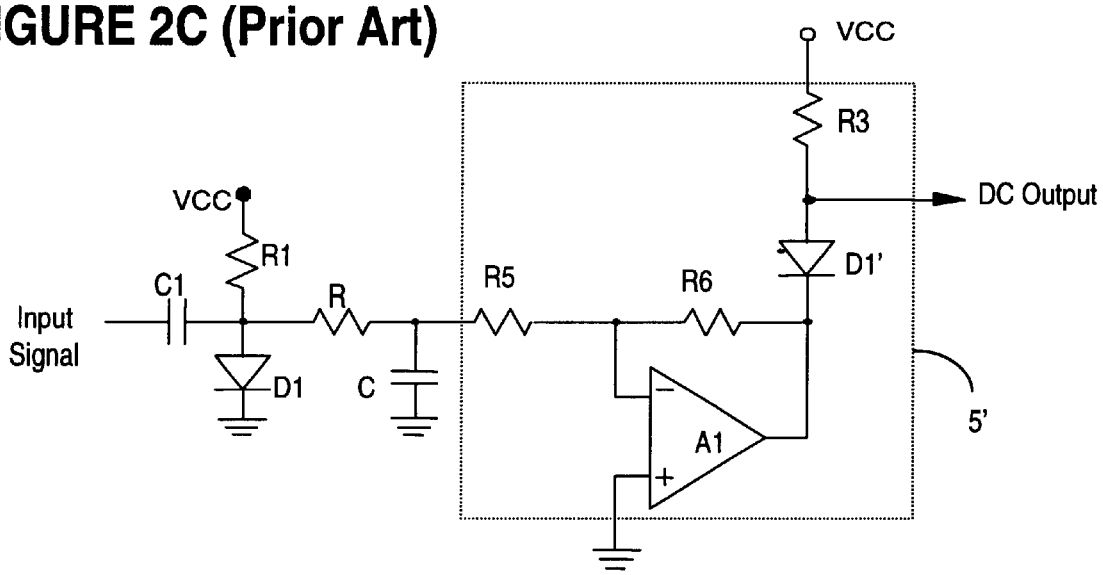
FIGURE 3
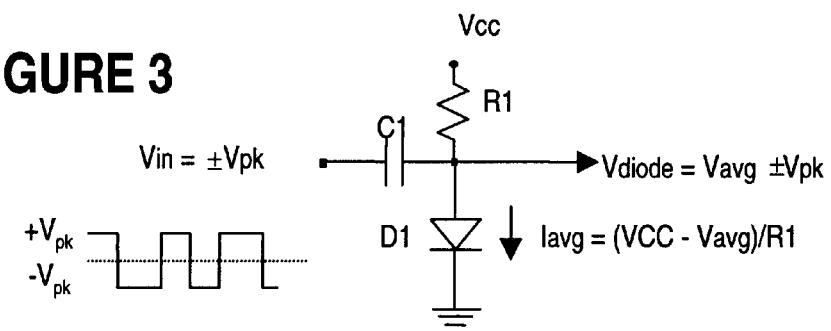
$V_{in} = \pm V_{pk}$
$V_{diode} = V_{avg} \pm V_{pk}$
$I_{avg} = (VCC - V_{avg})/R1$
FIGURE 4

N-DIODE PEAK DETECTOR

FIELD OF THE INVENTION

The invention is directed to a peak detector and in particular to a N-diode peak detector for a digital laser transmitter.

RELATED ART

In general, an optical transmitter comprises a semiconductor laser, which converts an RF electrical signal to an intensity-modulated optical signal suitable for propagation through fiber optic cables. During this conversion, the laser must be biased at a setting above the stimulated emission threshold referred to as the quiescent DC laser forward bias current. The laser also must be biased at a setting below a maximum power, for keeping the transmission system distortions at a low level.

Typically, a closed loop control circuit is used to maintain a constant quiescent optical output power of the laser. The optical feedback is generally carried out using a photodetector, placed in a suitable location to monitor either the optical power obtained from the rear facet of the laser, or the power emitted from the front facet, or both. The output of the photodetector is an electrical signal, indicative of the power of the monitored optical signal. In typical applications, this electrical signal is then filtered and conditioned via a transimpedance gain stage, developing a voltage proportional in magnitude to the laser optical power output, which is then used to control the bias of the laser.

Peak detectors measure the peak value of an input voltage using a non-linear element, as for example a diode. A peak detector may be connected in the closed loop after the filtering and amplification stages, to measure the amplitude of the output of the laser.

SUMMARY OF THE INVENTION

It is an object of the present invention to provide a peak detector for monitoring the output of a digital laser transmitters.

It is another object of the invention to provide a peak detector for input signals with amplitudes comparable with the threshold value of the detector diodes.

Accordingly, the invention provides a device for measuring the peak value $V_{pk}$ of a small amplitude AC balanced input signal comprising: a non-linear monitoring element for receiving the input signal and providing a detected signal of an average voltage $V_{avg}$; a compensation circuit coupled to the monitoring element for converting the average voltage $V_{avg}$ into a DC output signal proportional with the peak amplitude of the input signal, while tracking the changes in the amplitude of the input signal; and a biasing circuit for forward biasing the monitoring element.

Advantageously, the circuit according to the invention presents a high sensitivity to low input signals, as well as high accuracy over a large temperature range (0–70°) which are essential to the operation of digital laser transmitters.

BRIEF DESCRIPTION OF THE DRAWINGS

The foregoing and other objects, features and advantages of the invention will be apparent from the following more particular description of the preferred embodiments, as illustrated in the appended drawings, where:

FIG. 1 shows a current, voltage and temperature characteristic of a diode;

FIG. 2A shows capacitor charging peak detector (Prior art);

FIG. 2B is a capacitor charging peak detector with compensation (Prior art);

FIG. 2C is a modulated diode peak detector with compensation (Prior art);

FIG. 3 illustrates a digitally modulated diode;

FIG. 4 is an average voltage (Vavg) versus peak voltage (Vpk) diagram for the circuit of FIG. 3;

DETAILED DESCRIPTION

Figure 5:
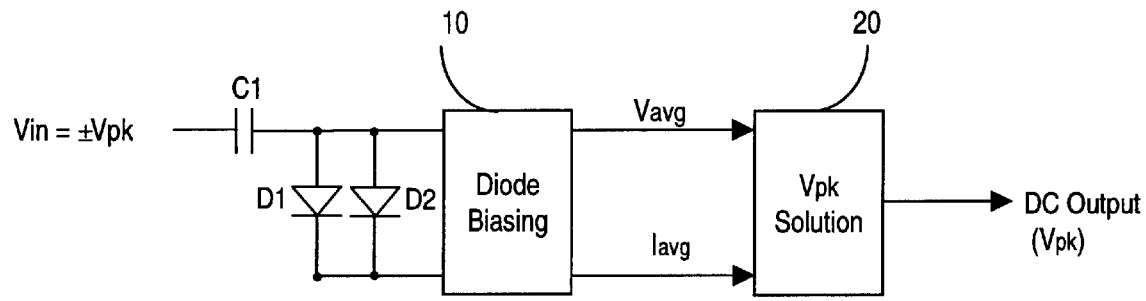
FIG. 5 shows a block diagram of one embodiment of the peak detector circuit of the invention, using two digitally modulated diodes.

FIG. 1 shows the $I_{diode}$–$V_{diode}$ characteristic of a diode, the numerical values on the abscissa and ordinate depending on the type of diode. We note herein the current passing through the diode with $I_{diode}$, the voltage across the diode with $V_{diode}$, the input current with Iin, and the input voltage with $V_{in}$.

As well known, a diode conducts in one direction only, and has a non-linear characteristic, which varies with the type of diode, the ambient temperature, the parameters of the input signal, etc.

The current passing through the diode $I_{diode}$ is a function of the applied voltage $V_{in}$ and ambient temperature. The voltage across the diode $V_{diode}$ is a function of the applied current Iin and ambient temperature.

The characteristic of a diode can be approximated as an exponential. The following equations describe these functions:

$$Idiode(Vin,\ T) = Is(e^{\frac{Vin}{Vt\frac{T}{298}}} - 1) \qquad \text{EQ 1}$$

$$Vdiode(Iin,\ T) := \frac{T}{298} Vt \cdot \ln\left(\frac{2 \cdot Iin}{Is} + 1\right) \qquad \text{EQ 2}$$

where T is the temperature in Kelvin degrees, $V_t$ is the voltage threshold voltage and $I_s$ is the current corresponding to the threshold voltage.

The threshold voltage Vt is the value of Vdiode where the current equals $I_s$ ($e^1$–1). Diodes are usually scaled such that this is a significant value relative to the application. Increasing $V_{diode}$ above $V_t$ results in a rapid increase in current. The following values could be considered typical for diodes used for peak detectors of a transmitter control loop, at room temperature: Vt:=0.26V and Is: =0.002A.

The characteristic of the diode can be approximated by the EQ1 at the values of interest in this description; although it tends to change for very large currents.

The non-linearity of the diode characteristic can be used to convert a high speed AC input signal or a digital input signal into a DC voltage. Three examples of prior art peak detectors are shown in FIGS. 2A to 2C, showing the principle of operation of this circuit. In the following, the non-linear element(s) (diodes) used for measuring the input voltage are referred to using the qualifier 'monitoring' or 'measuring'. As this non-linea element is modulated by the input signal, term 'modulated' may also be used.

The circuit of FIG. 2A uses a diode D to charge a capacitor C. The DC output is collected across the capacitor. Capacitor C1 and resistor R1 are chosen in a typical AC coupling configuration. Circuit of FIG. 2A is used for large signals where the amplitude of the input voltage is significantly larger than the diode threshold voltage, and is not suitable for laser bias control. Also, this circuit does not account for the variations in the voltage drop across the detector diode, which are negligible in the case of large input signals, but becomes important for input voltages comparable to the threshold voltage of the diode.

The circuit shown in FIG. 2B can be used for a signal whose amplitudes are as small as the diode threshold voltage. This detector uses a simple compensation circuit 5, comprising a differential amplifier A1 and a diode D3, connected between the output of A1 and the inverted input. In this way, the voltage across diode D is subtracted from the DC Output by differential amplifier A1 and diode D3. Diode D3 is selected so as to compensate for diode D offset into the measurement. However, the value for R2 can be chosen only for a single input amplitude and temperature. The compensation circuit 5 does not emulate the behaviour of diode D, when the amplitude of the input signal and temperature change. This failure to track is most significant at small input signals, where the offset of diode D is a large percentage of the measured signal amplitude.

The circuit shown in FIG. 2C is used for signals with amplitudes less than the diode threshold voltage. This circuit can be used to measure signal amplitudes as low as 1/4 the diode threshold voltage. In this example, the input signal is applied to a monitoring diode D1, which is always forward biased at a constant current. The output of the measurement circuit (R1, D1, R and C) is a DC voltage equal to the average voltage across diode D1. The compensation circuit 5' (R5, R6, A1, D1', R3) subtracts this voltage (R5=R6) from the voltage across diode D1'. R3 is chosen such that the current through diode D1' is approximately equal to twice the current through diode D1.

However, the circuit of FIG. 2C does not compensate for the variations of the average across diode D1 with the input signal or with the temperature, which are significant for very low input signals.

There are three assumptions for the compensation circuit design:
1) the current through D1, when the input signal is high, is much greater than when the input signal is low;
2) the current through D1 is constant;
3) the ratio of diode current $V_{diode}$ and $I_s$ is large.

The first assumption breaks down as the input signal decreases. A more sophisticated compensation circuit than circuit 5' is needed for voltages lower than 1/4 the diode threshold voltage.

FIGS. 3 and 4 show the operation of diode D1, modulated by an AC $$Iavg := \frac{\int_0^P Idiode(t) \cdot dt}{P} \quad \text{EQ 3}$$

$$Vavg := \frac{\int_0^P Vdiode(t) \cdot dt}{P}; \quad \text{EQ 4}$$

balanced digital signal input signal $Vi_n$, with the amplitude varying between $+V_{pk}$ and $-V_{pk}$. (An AC balanced digital signal is a digital signal, which has a similar number of logic '1' and logic '0'). The average voltage $V_{avg}$ and the average current $I_{avg}$ are equal to the integral of the current $V_{diode}$ and voltage $V_{diode}$ given by equations EQ1 and EQ2, respectively, divided by the averaging period, denoted with P:

With an AC balanced digital input signal, diode D1 spends almost 50% of time with one of the biasing voltages ($V_{avg}+V_{pk}$) or ($V_{avg}-V_{pk}$), and the rest of the time in transition between these two states. In a first approximation, ignoring the time in transition, the average voltage across the diode $V_{avg}$ is determined as an average of the minimum and maximum of the $V_{in}$. Similarly, $I_{avg}$ is determined as an average of the minimum current and maximum of the input current.

$$I_{avg} = (I_{max} + I_{min})/2 \quad \text{EQ 5}$$

When the input signal is logic '1', the voltage across diode D1 is ($V_{avg}+V_{pk}$). When the input signal is logic '0', the voltage across diode D1 is ($V_{avg}-V_{pk}$). As indicated above, signal transitions are not accounted for, and this may somewhat limit the accuracy of the proposed solution. Nevertheless, this solution is more accurate that the ones discussed in connection with FIGS. 2A to 2C (prior art).

We can calculate the $V_{avg}$ across diode D1 by solving EQ6 below. The left member of EQ6 is obtained by replacing the maximum and minimum values of the Idiode in EQ5 with the above values, and using EQ1 for the current-voltage dependency. The right member of EQ6 represents the average current through the resistor R1, which is equal to the average current through the diode.

$$\frac{Is(e^{\frac{Vavg+Vpk}{Vt \cdot 298}} - 1) + Is(e^{\frac{Vavg-Vpk}{Vt \cdot 298}} - 1)}{2} = \frac{Vcc - Vavg}{R1} \quad \text{EQ 6}$$

FIG. 4 illustrates an $V_{avg}-V_{pk}$ diagram, showing the average voltage $V_{avg}$ decreases as the $V_{pk}$ increases.

FIG. 5 shows a block diagram for a peak detector according to the invention, which generates a DC voltage output linearly proportional to the peak of the input digital signal $V_{in}$. A diode biasing unit 10 supplies the bias voltage for the modulated diodes D1, D2 and terminates the input signal. The $V_{pk}$ solution circuit 20 translates the average diode voltage and current into $V_{pk}$ as a DC voltage. The Vpk solution unit 20 is designed to match the characteristics of the digital modulation signal and to track over a large range of temperatures and digital signal amplitudes.

Figure 6:
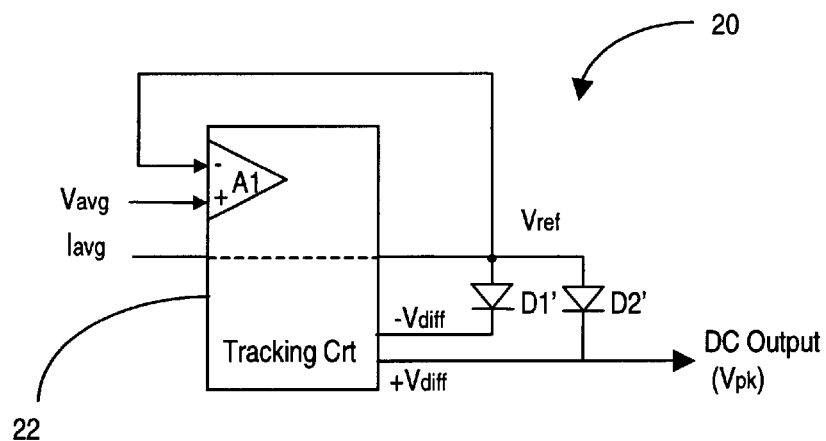
FIG. 6 illustrates a block diagram of an embodiment of the peak voltage solution of FIG. 5.

FIG. 6 shows the principle of operation of the $V_{pk}$ solution circuit 20 of FIG. 5, circuit 20 uses a pair of tracking diodes D1' and D2' biased to emulate the behaviour of the modulated diodes D1 and D2 as in EQ6. The total current through the diodes D1', D2' is forced to be equal to the average current of the modulated diodes D1, D. The voltage across D1', D2' is adjusted by a tracking circuit 22 to match the voltage across the modulated diodes D1, D2, using differential voltages $+V_{diff}$ and $-V_{diff}$. The differential voltage is presented by the tracking circuit such that, when the tracking circuit is locked $V_{ref}=V_{avg}$, and:

$$V_{diode}(D2') = V_{avg} + V_{diff}, \text{ and} \qquad \text{EQ 7}$$
$$V_{diode}(D1') = V_{avg} - V_{diff}$$

Applying EQ1 tracking diodes D1' and D2', we obtain:

$$Idiode(D1') = Is(e^{\frac{V_{avg}-V_{diff}}{V_t \cdot \frac{T}{298}}} - 1) \qquad \text{EQ 8}$$

$$Idiode(D2') = Is(e^{\frac{V_{avg}+V_{diff}}{V_t \cdot \frac{T}{298}}} - 1) \qquad \text{EQ 9}$$

The average current flowing through diodes D1 and D2 is given by the equation:

$$Iavg(D1) + Iavg(D2) = Is(e^{\frac{V_{avg}+V_{pk}}{V_t \cdot \frac{T}{298}}} - 1) + Is(e^{\frac{V_{avg}-V_{pk}}{V_t \cdot \frac{T}{298}}} - 1) \qquad \text{EQ 10}$$

When the tracking circuit is locked, i.e. the gain of the differential amplifier A1 is zero, the following equation is true:

$$I_{avg}(D1) + I_{avg}(D2) = I_{diode}(D1') + I_{diode}(D2') \qquad \text{EQ 11}$$

Therefore, the DC output voltage ($+V_{diff}$) equals the peak of the input voltage ($V_{pk}$) and the Vpk solution circuit creates a linear transfer function.

It is to be noted that, as discussed above, EQ6 and therefore EQ10, which gives the current $I_{avg}$ leave out the diode behaviour during the rising and falling edges of the modulating signal. This is not a concern since the tracking circuit does not specifically require that the tracking diode D1', or D2' behaves in a fashion identical to its respective model D1 or D2, and it relies only on the fact that the non-linear responses of the four diodes are matched.

It is also to be noted that, for accurate results, it is recommended that the four diodes are in the same package and are closely matched for process characteristics and temperature variations.

Other non-linear devices may be used instead of monitoring diodes D1, D2.

Figure 7:
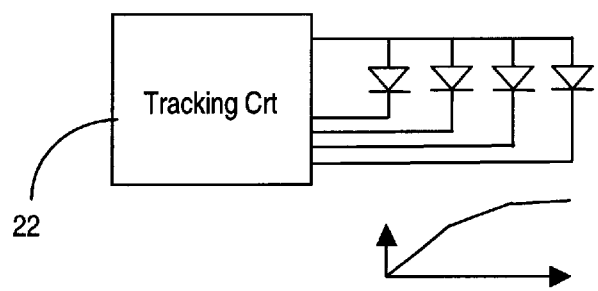
FIG. 7 illustrates the Vpk solution circuit using N diodes for measuring a sinusoidal signal in piecewise linear fashion.

FIG. 7 shows a more complex $V_{pk}$ solution circuit 20 using four tracking diodes for measuring analog signals. The tracking diodes have now a predetermined distribution of voltages, describing in a linear fashion the time domain voltage contour of a sinusoid. In such a case, the circuit has a reduced range of temperatures and signal amplitudes. By using a number N of tracking diodes with a predetermined distribution of voltages, analog signals may be measured with higher accuracy.

Figure 8:
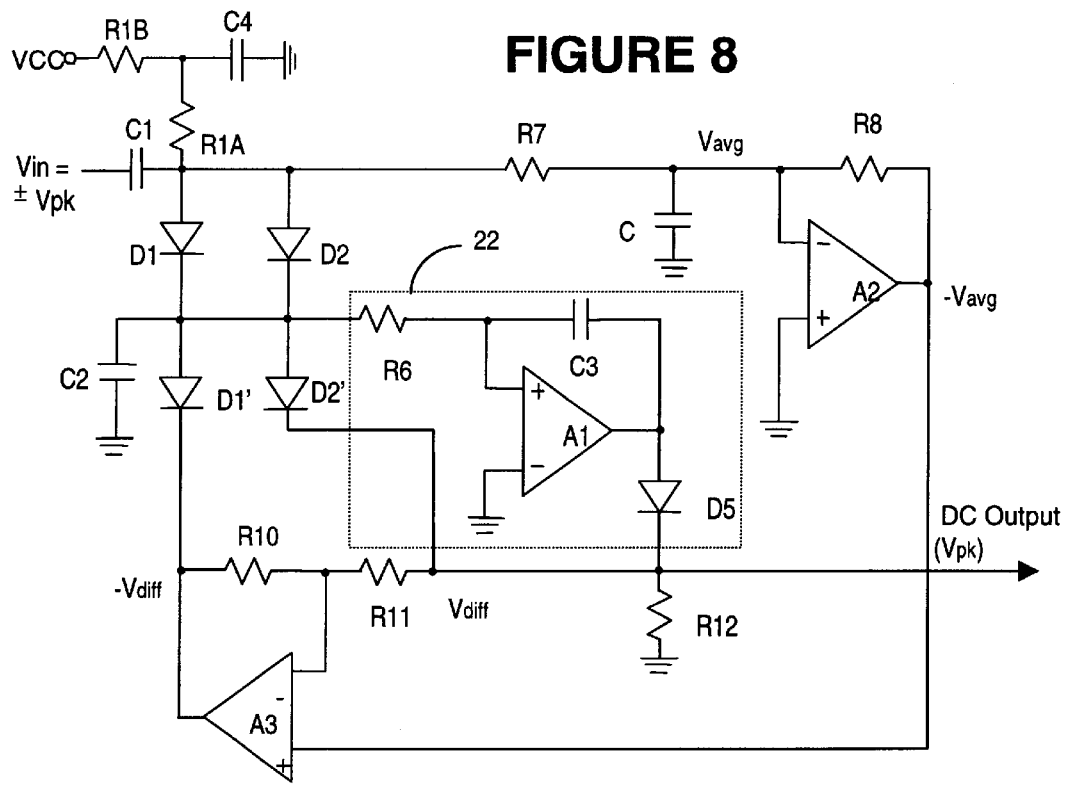
FIG. 8 illustrates an embodiment of a four-diode peak detector according to the invention.

FIG. 8 shows an example of a specific embodiment of a peak detector, with two measuring diodes D1 and D2, and two tracking diodes D1' and D2'. Modulating diodes D1 and D2 are arranged in parallel, and the tracking diodes D1' and D2' are connected with the anodes to a common terminal at the cathodes of monitoring diodes. VCC is divided between resistors R1A and R1B to supply a forward biasing voltage and current to modulated diodes D1, D2. As it could be readily appreciated, diode biasing unit 10 is not a distinct circuit, in that some components will have also an additional role in operation of the detector. As shown in FIG. 5, optical amplifier A1 biases the C2-R6 node voltage to GND. This combined with Vcc, R1A and R1B biases the measurement diodes D1 and D2.

The input signal modulates the voltage across diodes D1 and D2. A capacitor C1 blocks the DC component of the input signal, while capacitor C2 supplies an AC ground to the cathodes of diodes D1, D2. The input signal is terminated by an impedance equal to R1A in parallel with D1, D2. Resistor R7 and capacitor C are chosen to filter out the AC component of the voltage across diodes D1, D2, and they also measure the average voltage across diodes D1, D2. This voltage is inverted relative to the ground by differential amplifier A2, (resistors R7 and R8 have equal value), and A2 supplies this inverted voltage to operational amplifier A3 for the D1' and D2' biasing. These diodes are biased between a reference voltage in the common terminal and $+V_{diff}$, $-V_{diff}$, respectively, so that D1' conducts during the positive half of the input signal, while D2' conducts for the negative half.

Capacitor C charges at average voltage $V_{avg}$. However, as discussed above in connection with the examples of FIGS. 2A to 2C, this voltage is dependent upon the voltage across the modulating diodes D1 and D2 and as such, it varies with the amplitude of the input voltage, ambient temperature, etc. As discussed above in connection with FIG. 6, diodes D1' and D2' are biased so as to emulate the behavior of diodes D1 and D2, using a tracking circuit 22.

The tracking circuit 22 comprises a differential amplifier A1, resistor R6, capacitor C3 and diode D5. In addition to supplying AC ground to the cathodes of modulated diodes D1 and D2, tracking circuit holds the voltage at the cathodes of diodes D1, D2 to ground by adjusting the differential voltage of tracking diodes D1', D2' (i.e. R10=R11). Diode D5 forces a positive polarity to an otherwise symmetric circuit. Also, capacitor C2 is chosen such that the total current flowing through diodes D1' and D2') is not modulated, and is equal to the average of the total current flowing through diodes D1 and D2.

When the circuit is locked, the voltage across D2' is equal to the average voltage across diodes D1 and D2 plus $V_{pk}$:

$$V_{diode}(D2')=V_{avg}+V_{pk}$$

Similarly, the voltage across D1' is respectively equal to the average voltage across diodes D1 and D2 minus $V_{pk}$:

$$V_{diode}(D1')=V_{avg}-V_{pk}$$

The DC Output is collected between a diode D5 and a resistor R12. Resistor R12 must be small because its size limits the sensitivity of the tracking circuit 22.

Figure 9:
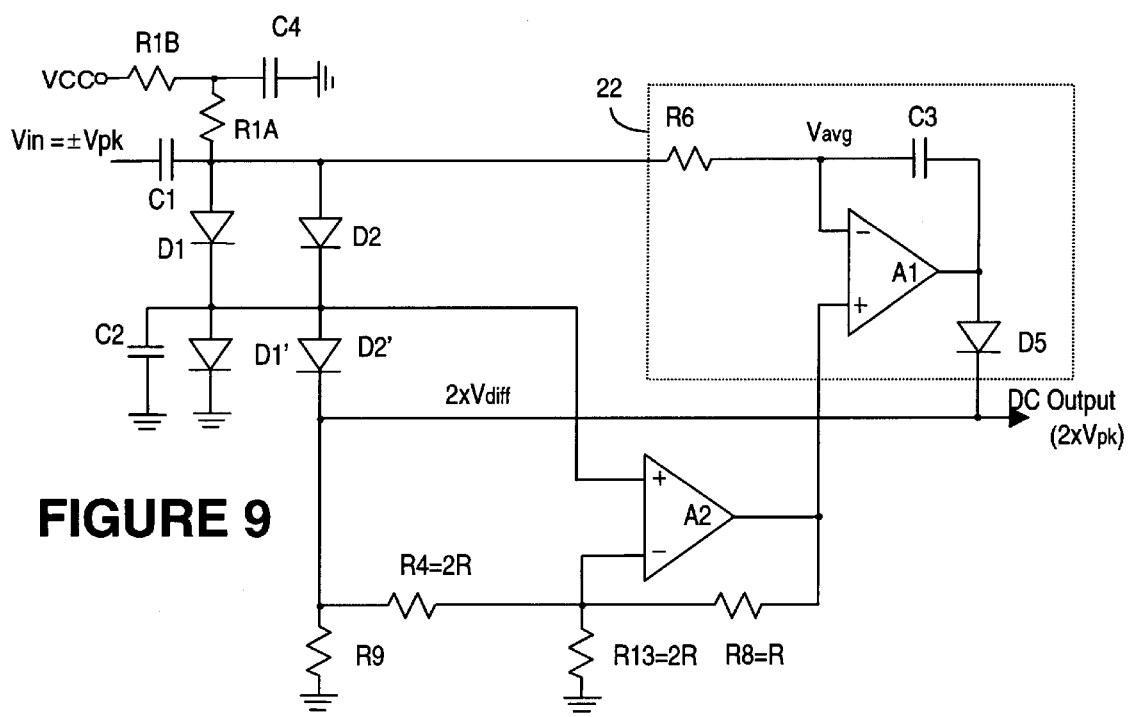
FIG. 9 illustrates another embodiment of a four-diode peak detector.

FIG. 9 shows another implementation of the four-diode peak detector with a single suppply. In this embodiment, differential amplifiers A1 and A2 participate in biasing along with Vcc and R1A, R1B. The term 'single supply' is used since only one voltage supply source is required for this embodiment.. This is different from the embodiment of FIG. 8, where differential amplifier A3 needs to supply a. negative voltage on the cathode of D1. As in FIG. 8, the tracking circuit 22 includes differential amplifier A1, resistor R6 and capacitor C3, and adjusts the offset voltage between D1' and D2' until the voltage across D1, D2 equals the sum of the voltages across the tracking diodes D1' and D2':

$$V_{diode}(D1, D2)=V_{diode}(D1')+V_{diode}(D2').$$

The DC Output voltage is in this example equal to $2 \times V_{pk}$.

Figure 10:
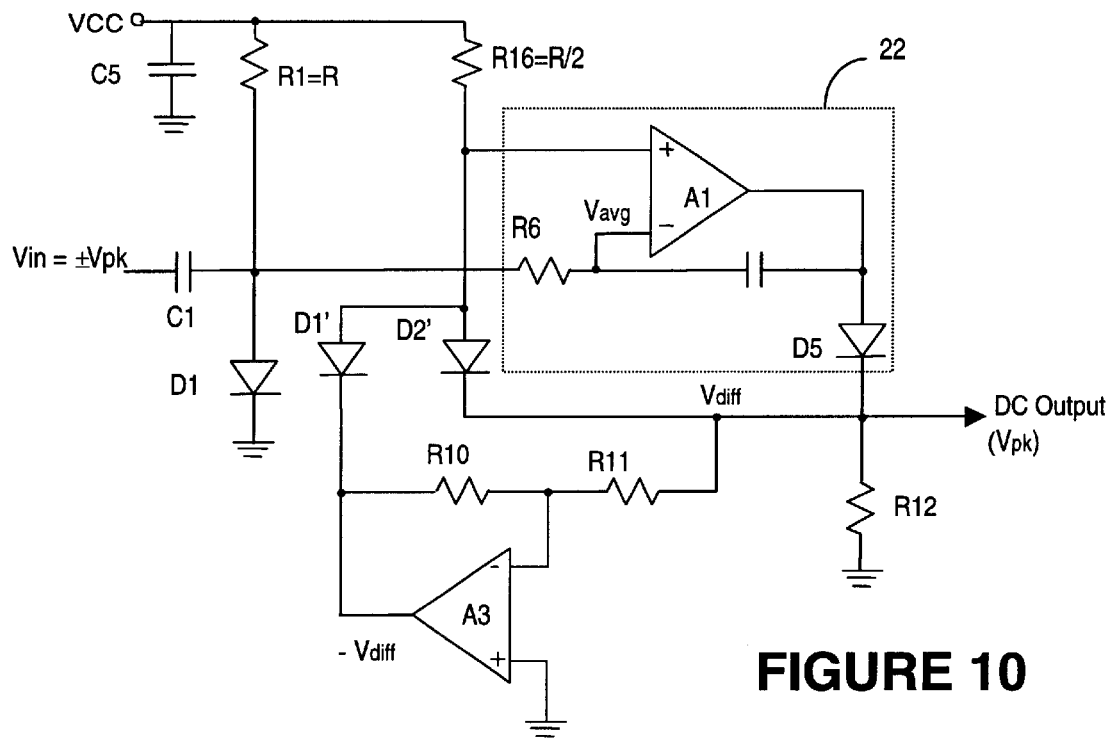
FIG. 10 shows an embodiment of the invention using one monitor diode and two tracking diodes.

FIG 10 illustrates a different implementation, which uses one monitoring diode D1 and two tracking diodes D1', D2'.

In this embodiment, D1 is biased by Vcc and R1. Matching of R16 to half of the value of R1 critical.

Equal current is maintained over the monitoring diode and the tracking diodes by setting the value of resistor R16 to half of the value of resistor R1.

The tracking circuit 22 comprises differential amplifier A1, resistor R6 and C3, and matches the average voltage across D1', D2' by varying the differential voltage generated by the differential amplifier A3, and resistors R10, R118.

Figure 11:
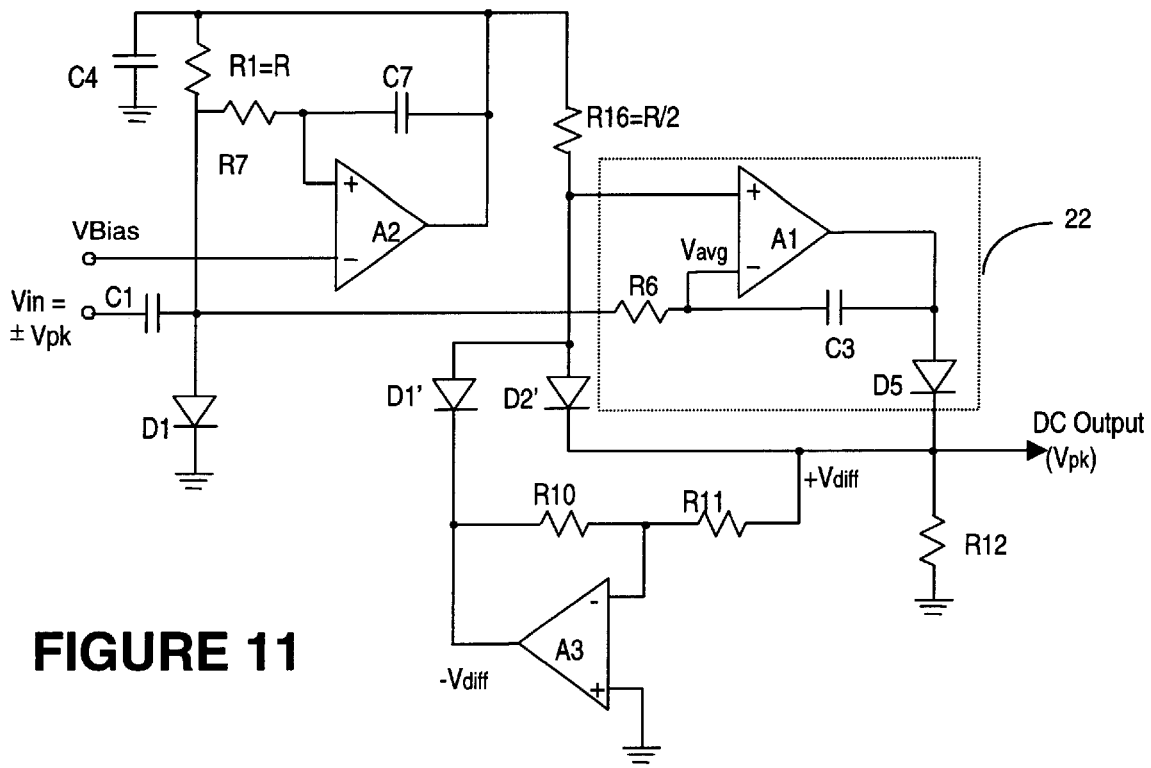
FIG. 11 illustrates the peak detector of FIG. 10 in a circuit maintaining a constant voltage across the monitor diode.

It is to be noted that variations in the diode biasing circuit 10 are possible where the average voltage across the monitoring diodes is held constant and only the current varies with modulation voltage, as shown in FIG. 11.

FIG. 11 illustrates still another embodiment of a peak detector, which maintains a constant voltage ($V_{avg}$) across the monitoring diode D1, equal to a predetermined voltage. In this embodiment, $V_{bias}$, A2, R7 and R1 bias diode D1 at a constant voltage. $I_{avg}$ varies with the amplitude of the modulation digital signal. $V_{bias}$ is provided on a separate line.

Figure 12:
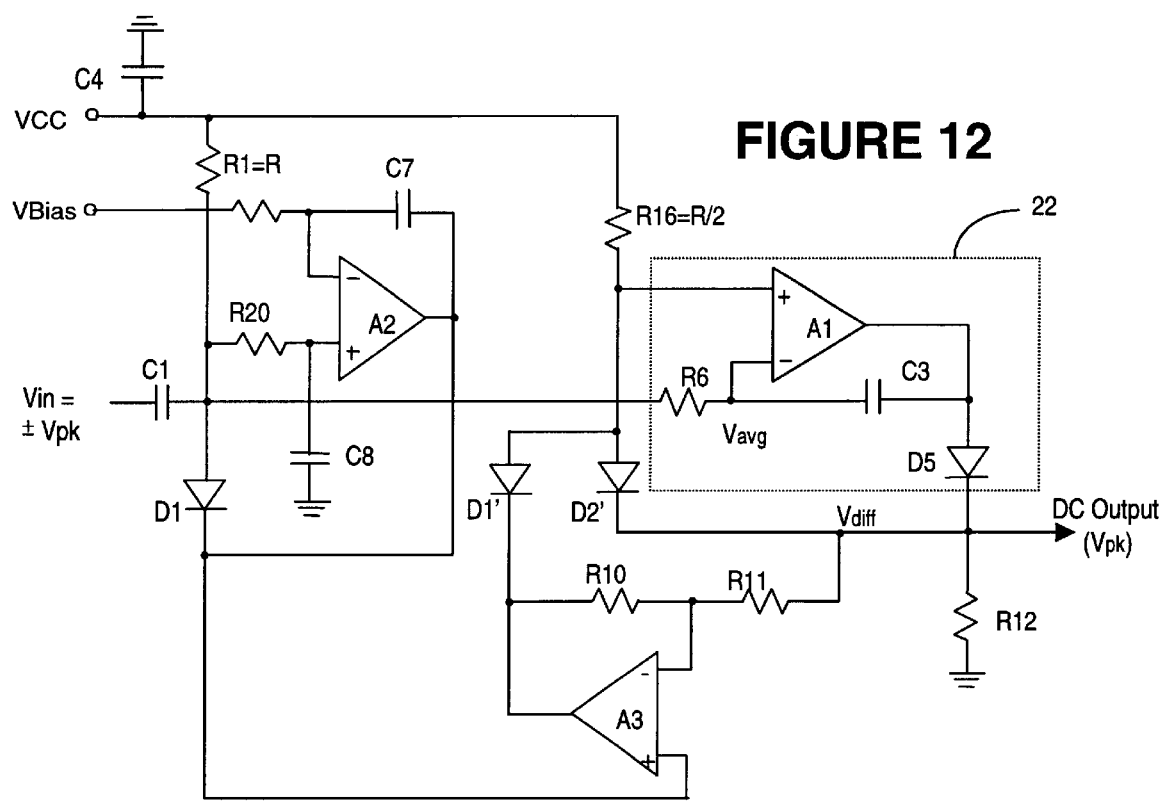
FIG. 12 illustrates the peak detector of FIG. 10 in a circuit maintaining constant current through the monitor diode.

Alternatively the current through detector diodes D1, D2 can be held constant and only the voltage varies with modulation voltage, as shown in FIG. 12.

FIG. 12 illustrates a peak detector, which maintains constant the current through the detector diode D1. Here, $V_{bias}$, A2, R20 and R1 bias diode D1 at a constant current. Vbias is provided on a separate line. $I_{avg}$ is equal to a predetermined value. Vavg varies with the amplitude of the modulation digital signal. In this embodiment, the voltages are relative to the output of differential amplifier A2. Thus, Vavg is equal to the negative input to A1 minus the output of A2; $V_{diff}$ is the DC Output $V_{pk}$ minus the output of A2; –Vdiff is the output of A3 minus the output of A2. An additional operational amplifier circuit is necessary to properly convert "DC Output" to $V_{pk}$ relative to ground.

The peak detector circuit according to the invention may be used, as discussed above to monitor the bias for the laser of an optical transmitter. Other applications are possible falling under a number of categories including: automatic gain control loops, input signal power measurement and signal loss detect, and output driver calibration.

While the invention has been described with reference to particular example embodiments, further modifications and improvements which will occur to those skilled in the art, may be made within the purview of the appended claims, without departing from the scope of the invention in its broader aspect.

We claim:

1. A device for measuring the peak value $V_{pk}$ of a small amplitude AC balanced input signal comprising:
    a non-linear monitoring element for receiving said input signal and providing a detected signal of an average voltage $V_{avg}$;
    a compensation circuit coupled to said monitoring element for converting said average voltage $V_{avg}$ into a DC output signal proportional with the peak amplitude of said input signal, while tracking the changes in the amplitude of said input signal; and
    a biasing circuit for forward biasing said monitoring element.

2. A device as claimed in claim 1, wherein said compensation circuit comprises:
    a first non-linear tracking element, biased to provide a voltage drop similar to the voltage drop across said non-linear element whenever said input voltage is minimum;
    a second non-linear tracking element, biased to provide a voltage drop similar with the voltage drop across said non-linear element whenever said input voltage is maximum; and
    a tracking circuit for measuring the variation of the voltage across said second tracking element and adjusting the bias of said tracking elements accordingly.

3. A device as claimed in claim 2, wherein said first and said second tracking elements are diodes with the anodes connected to a common terminal to provide a reference voltage.

4. A device as claimed in claim 3, wherein said common terminal is connected to the AC ground.

5. A device as claimed in claim 1, wherein said monitoring element is a forward biased monitoring diode.

6. A device as claimed in claim 1, wherein said monitoring element is a pair of monitoring diodes connected in parallel.

7. A device as claimed in claim 3, wherein said tracking circuit comprises a first operational amplifier for providing a differential voltage Vdiff and a diode connected at the output of said first operational amplifier for providing said differential voltage $+V_{diff}$ on the cathode of said second tracking diode.

8. A device as claimed in claim 7, wherein said tracking circuit adjusts said differential voltage $V_{diff}$ until the gain of said first operational amplifier becomes zero.

9. A device as claimed in claim 8, wherein said monitoring element is a pair of monitoring diodes connected with the cathodes to said common terminal and with the anodes to receive said input signal.

10. A device as claimed in claim 9, wherein said first operational amplifier is connected to compare said reference voltage to ground.

11. A device as claimed in claim 10 further comprising a second operational amplifier for receiving said differential voltage $V_{diff}$ and a negative variant of said average voltage and providing a negative variant $-V_{diff}$ of said differential voltage on the cathode of said first tracking diode.

12. A device as claimed in claim 11, further comprising a third differential amplifier for providing said negative variant of said average voltage.

13. A device as claimed in claim 9, wherein said tracking circuit adjusts aid differential voltage between said first and said second tracking diodes until the voltage across said pair of monitoring diodes equals half of the sum of the voltages across said first and second tracking diodes.

14. A device as claimed in claim 8, wherein said monitoring element is a monitoring diode with the cathode connected to the ground.

15. A device as claimed in claim 14, wherein said tracking circuit adjusts said differential voltage $V_{diff}$, while maintaining equal currents through said monitoring diode and said tracking diodes.

16. A device as claimed in claim 15 further comprising a second operational amplifier for receiving said differential voltage $V_{diff}$ and providing a negative variant $-V_{diff}$ of said differential voltage on the chatode of said first tracking element.

17. A device as claimed in claim 14, wherein said tracking circuit adjusts said differential voltage $V_{diff}$, while maintaining a constant voltage across said monitoring diode.

18. A device as claimed in claim 3, wherein said tracking circuit comprises an operational amplifier connected to compare said reference voltage with said average voltage.

19. A device as claimed in claim 3, wherein said modulating diodes and said tracking diodes are mounted in the same package.

* * * * *